(12) United States Patent
Tachino (10) Patent No.: US 12,386,046 B2
(45) Date of Patent: Aug. 12, 2025

(54) OPTICAL RANGING DEVICE AND METHOD FOR DETECTING OCCURRENCE OF ABNORMALITY IN THE SAME

(71) Applicant: DENSO CORPORATION, Kariya (JP)

(72) Inventor: Yoshihide Tachino, Kariya (JP)

(73) Assignee: DENSO CORPORATION, Kariya (JP)

( * ) Notice: Subject to any disclaimer, the term of this patent is extended or adjusted under 35 U.S.C. 154(b) by 1036 days.

(21) Appl. No.: 17/375,795

(22) Filed: Jul. 14, 2021

(65) Prior Publication Data

US 2021/0341592 A1  Nov. 4, 2021

Related U.S. Application Data

(63) Continuation of application No. PCT/JP2019/049602, filed on Dec. 18, 2019.

(30) Foreign Application Priority Data

Jan. 16, 2019 (JP) .................................. 2019-004953

(51) Int. Cl.
*G01S 7/497* (2006.01)
*G01S 7/484* (2006.01)
(Continued)

(52) U.S. Cl.
CPC .............. *G01S 7/497* (2013.01); *G01S 7/484* (2013.01); *G01S 7/4863* (2013.01); *G01S 17/931* (2020.01); *H10F 30/225* (2025.01)

(58) Field of Classification Search
CPC .... G01S 7/4811; G01S 7/4813; G01S 7/4814; G01S 7/4816; G01S 7/484; G01S 7/486;
(Continued)

(56) References Cited

U.S. PATENT DOCUMENTS

2009/0315135 A1* 12/2009 Finkelstein ........... H01L 31/107
257/E31.113
2012/0236290 A1* 9/2012 Eisele ..................... G01S 7/497
356/6
(Continued)

FOREIGN PATENT DOCUMENTS

JP            10-319121 A     12/1998
JP         2016-176750 A     10/2016

*Primary Examiner* — Yuqing Xiao
*Assistant Examiner* — Zhengqing Qi
(74) *Attorney, Agent, or Firm* — Maschoff Brennan (57) ABSTRACT

In an optical ranging device, a light source unit is configured to emit irradiation light to irradiate a measurement region, and a light receiving unit has a light-receiving surface provided with an array of single photon avalanche diodes (SPADs) and is configured to use the SPADs to detect photons of reflected light of the irradiation light. A controller is configured to control the light source unit and the light receiving unit and perform a distance measurement process to measure a distance to an object in the measurement region using signals output from the SPADs upon receipt of measurement reflected light that is reflected light of the irradiation light from the object in the measurement region. A determiner is configured to determine presence or absence of an abnormality in the light receiving unit using signals output during a dead time following incidence of photons of clutter reflected light on the SPADs.

8 Claims, 6 Drawing Sheets

(51) Int. Cl.
　　　*G01S 7/4863*　　　(2020.01)
　　　*G01S 17/931*　　　(2020.01)
　　　*H10F 30/225*　　　(2025.01)

(58) Field of Classification Search
　　　CPC ...... G01S 7/4861; G01S 7/4863; G01S 7/497;
　　　　　　　G01S 17/08; G01S 17/10; G01S 17/931;
　　　　　　　　　　　　　　　　　　　　　H01L 31/107
　　　See application file for complete search history.

(56) References Cited

U.S. PATENT DOCUMENTS

| | | | |
|---|---|---|---|
| 2014/0218715 A1* | 8/2014 | Li | G01S 7/497 |
| | | | 356/4.01 |
| 2015/0261065 A1* | 9/2015 | Sartor | G02F 7/00 |
| | | | 341/137 |
| 2016/0306032 A1* | 10/2016 | Schwarz | G01S 7/4812 |
| 2019/0011541 A1 | 1/2019 | O'Keeffe | |
| 2019/0170866 A1* | 6/2019 | Iguchi | G01S 17/10 |

\* cited by examiner

OPTICAL RANGING DEVICE AND METHOD FOR DETECTING OCCURRENCE OF ABNORMALITY IN THE SAME

CROSS-REFERENCE TO RELATED APPLICATION

This application is based on and claims the benefit of priority from Japanese Patent Application No. 2019-004953 filed Jan. 16, 2019, the entire disclosure of which is incorporated herein by reference.

BACKGROUND

Technical Field

This disclosure relates to an optical ranging device.

Related Art

An optical ranging device is known that measures a distance to an object based on a time of flight (TOF) of light from emission of the light into a measurement region to receipt of its reflected light from the object in the measurement region. For example, an optical ranging device is known that uses, as an optical element that receives the reflected light from the measurement region, a single photon avalanche diode (SPAD) for detecting incidence of a single photon.

DESCRIPTION OF SPECIFIC EMBODIMENTS

In the above known optical ranging device, as disclosed in JP-A-2016-176750, abnormalities may occur in the light receiving unit due to, for example, time degradation caused by defects within a semiconductor of each SPAD, and the like. Such time degradation of the SPAD may cause an increase in dark current that flows regardless of light reception, leading to degradation in the measurement performance of the ranging device and a source of failures. The abnormalities in the light receiving unit, not limited to the time degradation of the SPAD, can be readily detected in environments where the ambient light is constant, as in environments where tests are performed in the initial shipping phase. However, the optical ranging device is commonly used in environments where the ambient light is not always constant, such as for vehicle use. Thus, it has not been easy to detect abnormalities in the light receiving unit under such ordinary usage environments.

In view of the above, in the optical ranging device, there is still room for improvement in accurately detecting abnormalities in the light receiving unit without being affected by the ambient light.

One aspect of the present disclosure provides an optical ranging device. In this optical ranging device, a light source unit is configured to emit irradiation light to irradiate a measurement region, and a light receiving unit has a light-receiving surface provided with an array of single photon avalanche diodes (SPADs) and is configured to use the SPADs to detect photons of reflected light of the irradiation light. A housing accommodates the light source unit and the light receiving unit. A controller is configured to control the light source unit and the light receiving unit and perform a distance measurement process to measure a distance to an object in the measurement region using signals output from the SPADs upon receipt of measurement reflected light that is reflected light of the irradiation light from the object in the measurement region. A determiner is configured to determine presence or absence of an abnormality in the light receiving unit using signals output from the SPADs upon receipt of clutter reflected light that is reflected light of the irradiation light reflected within the housing. The determiner is further configured to determine presence or absence of an abnormality in the light receiving unit using signals output during a dead time following incidence of photons of the clutter reflected light on the SPADs.

With the ranging device configured as above, the clutter reflected light reflected within the housing is used to detect an abnormality in the light receiving unit. Therefore, even in an environment where ambient light is not constant, occurrence of an abnormality in the light receiving unit 30 can be accurately detected.

1. First Embodiment

Figure 1:
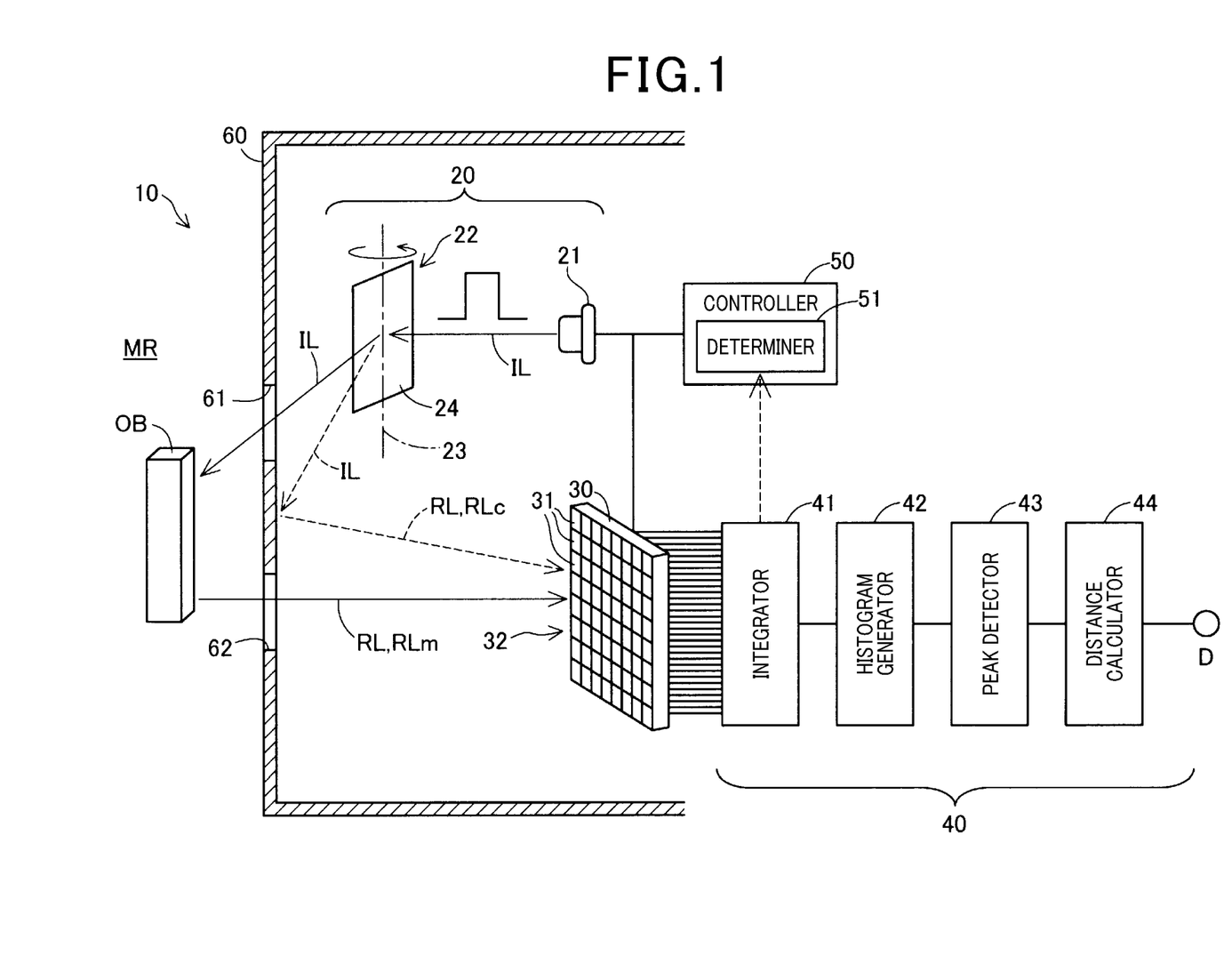
FIG. 1 is a schematic diagram of an optical ranging device.

Referring to FIG. 1, an optical ranging device 10 in a first embodiment uses a time of flight (TOF) of light from emission of irradiation light IL into a measurement region MR to receipt of its reflected light from an object OB in the measurement region MR to measure a distance to the object OB. Hereinafter, the optical ranging device 10 is also simply referred to as the ranging device 10. The process in which the ranging device 10 emits the irradiation light IL into the measurement region MR and thereby measures the distance to the object OB in the measurement region MR is called a "distance measurement process". In the first embodiment, the ranging device 10 is mounted to a vehicle and measures a distance between the vehicle and an object OB around the vehicle via the distance measurement process.

The ranging device 10 includes a light source unit 20 that emits irradiation light IL, a light receiving unit 30 that receives reflected light RL of the irradiation light IL, and a measurement unit 40 that processes a signal output from the light receiving unit 30 and outputs a result of measurement of distances, and a controller 50 that controls the entire ranging device 10. The ranging device 10 further includes a housing 60. The light source unit 20 and the light receiving unit 30 are fixed in an internal space surrounded by inner walls of the housing 60. In FIG. 1, the right end of the housing 60 is omitted for convenience of illustration.

The light source unit 20 includes a laser source 21 and a scanning unit 22. The laser source 21 is formed of a semiconductor laser diode and configured to emit pulsed laser light as irradiation light IL. The scanning unit 22 includes a mirror 24 that rotates around a rotary shaft 23 under control of the controller 50. The mirror 24 is, for example, a micro-electromechanical system (MEMS) mirror. The irradiation light IL emitted from the laser source 21 is reflected by the mirror 24 of the scanning unit 22. The irradiation light IL is scanned according to the rotation angle of the mirror 24. When the mirror 24 is at a given angle of rotation, the irradiation light IL reflected by the mirror 24 is emitted into the measurement region MR through a launch opening 61 provided in the housing 60, as illustrated by the solid arrow in FIG. 1. The irradiation light IL that is not emitted from the launch opening 61 is reflected and scattered within the housing 60 as indicated by the dashed arrow in FIG. 1.

The light receiving unit 30 has a light-receiving surface 32 provided with an array of single photon avalanche diodes (SPADs) 31 that operate in a Geiger mode. The SPADs 31 form a two-dimensional array on the light-receiving surface 32. Each of the SPADs 31 is configured to, in response to incidence of a single photon, output a pulse signal indicating incidence of the single photon, with a certain probability. In response to light incident on the light-receiving surface 32, signals will be output from the number of SPADs 31 corresponding to the intensity of the incident light. That is, the higher the intensity of light incident on the light-receiving surface 32, the greater the number of SPADs 31 that respond to the incident light.

As described above, the light receiving unit 30 receives reflected light RL of the irradiation light IL emitted from the light source unit 20. Hereinafter, the reflected light RL of the irradiation light IL, reflected from the object OB in the measurement region MR, is referred to as "measurement reflected light RLm", and internal scattering light that is the reflected light RL of the irradiation light IL, reflected within the housing 60, is referred to as "clutter reflected light RLc". As indicated by the solid arrow in FIG. 1, the measurement reflected light RLm enters the housing 60 from the measurement region MR through an incident opening 62 and reaches the light-receiving surface 32 of the light receiving unit 30. As indicated by the dashed arrow in FIG. 1, the clutter reflected light RLc is reflected from an inner wall surface of the housing 60 and reaches the light-receiving surface 32 of the light receiving unit 30.

In the ranging device 10, signals output from the SPADs 31 during a predetermined period of time from emission of one pulse of irradiation light IL by the light source unit 20 are considered to be signals output in response to incidence of the clutter reflected light RLc and are not used in the distance measurement process. Hereinafter, the predetermined period of time from emission of one pulse of irradiation light IL by the light source unit 20 is referred to as a "clutter reflected light period". The clutter reflected light period is determined based on the speed of light and an optical distance between the light source unit 20 and the light receiving unit 30 within the housing 60. The clutter reflected light period may be defined as a period of time greater than a period of time from emission of the irradiation light IL by the light source unit 20 to arrival of the clutter reflected light RLc at the light-receiving surface 32 of the light receiving unit 30. The clutter reflected light period may further be defined as a period of time less than at least a minimum expected period of time from emission of the irradiation light IL by the light source unit 20 to arrival of the measurement reflected light RLm at the light-receiving surface 32.

The ranging device 10 according to the present embodiment uses signals output from the SPADs 31 in response to incidence of the clutter reflected light RLc during the clutter reflected light period, in an abnormality detection process for detecting occurrence of an abnormality in the light receiving unit 30. The abnormality detection process will be described later. In the distance measurement process, the ranging device 10 uses signals output from the light receiving unit 30 after the clutter reflected light period elapses from emission of the irradiation light IL by the light source unit 20 to determine a distance to the object OB in the measurement region MR.

The measurement unit 40 includes an integrator 41, a histogram generator 42, a peak detector 43, and a distance calculator 44. Each of these elements of the measurement unit 40 is formed of one or two or more integrated circuits. In an alternative embodiment, at least some of these elements of the measurement unit 40 may be implemented in a software-based manner by a CPU executing a program.

The signals output from the respective SPADs 31 of the light receiving unit 30 are input to the integrator 41. The integrator 41 acquires an integrated value that results from counting the number of pulse signals output from the respective SPADs 31 at approximately the same time, and outputs, to the histogram generator 42, the integrated value as a signal value of an output signal from the light receiving unit 30. Each signal value output from the integrator 41 represents the number of responses of the SPADs 31 to receipt of the reflected light RL by the light receiving unit 30. During the abnormality detection process described later, the integrator 41 outputs, to the determiner 51 of the controller 50, the signal values of the output signals from the light receiving unit 30 during the clutter reflected light period.

The histogram generator 42 generates a histogram based on the signal values received from the integrator 41. Each bin of this histogram indicates a TOF from emission of the irradiation light IL by the light source unit 20 to arrival of the reflected light RL at the light-receiving surface 32. Frequencies of this histogram are the signal values output from the integrator 41 and represent intensities of the reflected light RL. The histogram generator 42 generates a histogram by recording the signal value output from the integrator 41 for each TOF according to a predetermined record timing signal, and outputs the histogram to the peak detector 43.

The peak detector 43 detects a peak from the histogram output from the histogram generator 42. The peak detector 43 determines that a portion of the histogram having the highest frequency is a peak. The peak in the histogram indicates that there is an object OB at a distance corresponding to the TOF corresponding to the peak.

The distance calculator 44 calculates a distance value D from the TOF corresponding to the peak detected by the peak detector 43. The distance calculator 44 calculates the distance value D according to the following equation (1):

$$D = (c \times \Delta t)/2 \tag{1}$$

where $\Delta t$ is the TOF corresponding to the peak, c is the speed of light, and D is the distance value.

The distance value D measured by the measurement unit 40 is output from the ranging device 10 to an electronic control unit (ECU) of the vehicle. The ECU of the vehicle uses the distance value D acquired from the ranging device 10 to detect an object OB that is an obstacle in the measurement region MR. The ECU of the vehicle provides vehicle driving assistance to avoid a collision with the detected obstacle.

The controller 50 is configured as a microcomputer including a processor and a memory. The controller 50 is connected to the light source unit 20, the light receiving unit 30, and the measurement unit 40 through signal lines. The controller 50 controls the light source unit 20, the light receiving unit 30, and the measurement unit 40 to perform the distance measurement process described above. The controller 50 includes, as a functional block, a determiner 51 that performs an abnormality detection process described later to determine the presence or absence of an abnormality in the light receiving unit 30. In an alternative embodiment, the determiner 51 may be separate from the controller 50.

Figure 2:
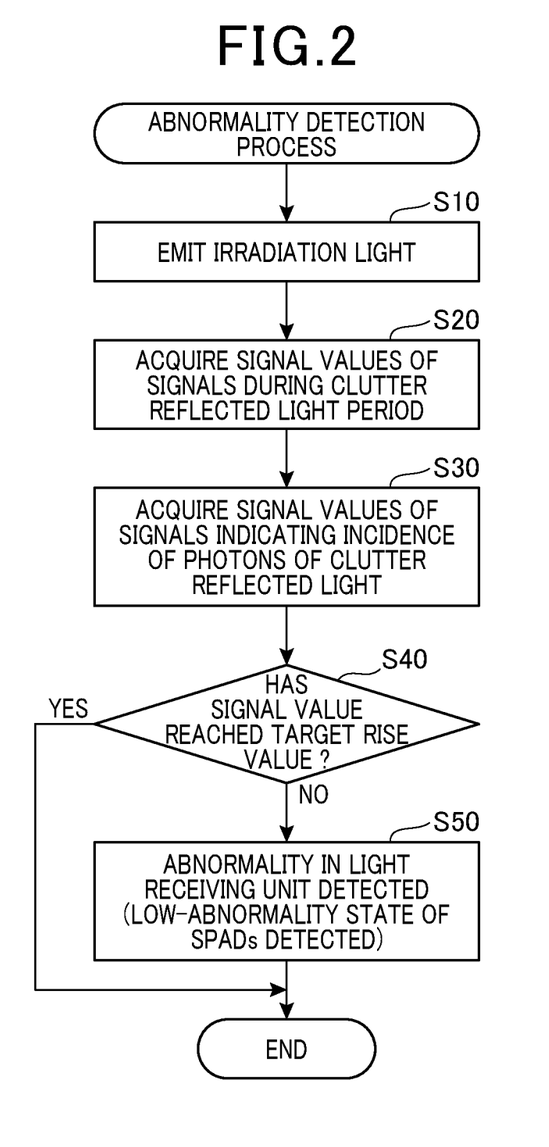
FIG. 2 is a flowchart of an abnormality detection process according to a first embodiment.

Referring to FIG. 2, in the abnormality detection process, the determiner 51 detects occurrence of an abnormality in the light receiving unit 30 using the signals output from the light receiving unit 30 in response to the clutter reflected light RLc. The determiner 51 performs the abnormality detection process at predetermined timings while the controller 50 is not performing the distance measurement process. The abnormality detection process is performed with a predefined periodicity, for example, at predetermined timings while the vehicle is stopped or parked. The abnormality detection process may be performed at timings commanded by the user. The user may preset the frequency at which the abnormality detection process is performed by the determiner 51.

At step S10, the determiner 51 causes the light source unit 20 to emit irradiation light IL. The intensity of the irradiation light IL may be similar to the intensity as in the distance measurement process. At step S20, the determiner 51 acquires, from the integrator 41, signal values of signals output from the light receiving unit 30 during the clutter reflected light period described above. At step S30, the determiner 51 acquires signal values during a period of time in which signals indicating incidence of photons of the clutter reflected light RLc on the SPADs 31 are output, among the signal values acquired at step S20. In the first embodiment, at steps S40 to S50, the determiner 51 determines whether an abnormality is occurring in the light receiving unit 30, using the signal values of the signals indicating incidence of photons of the clutter reflected light RLc on the SPADs 31.

Figure 3A:
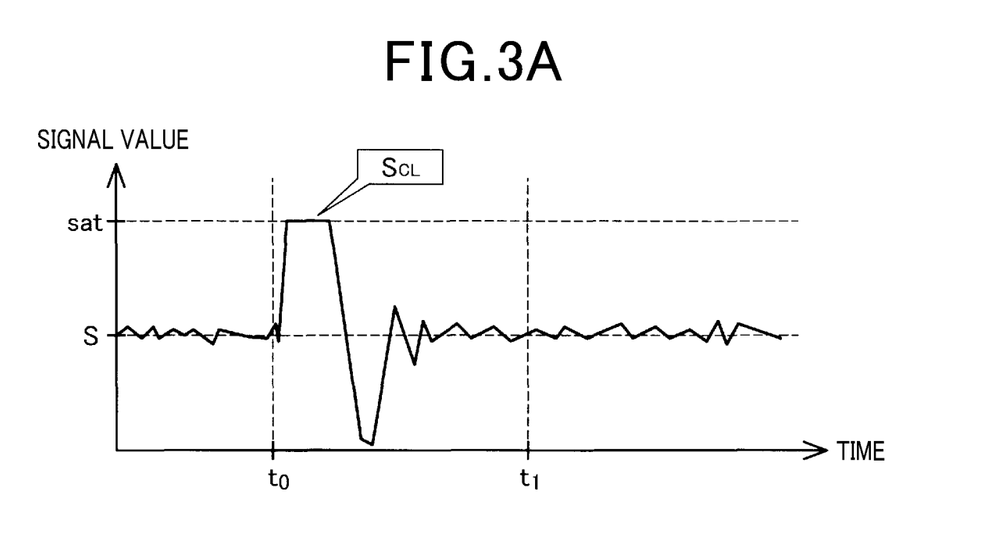
FIG. 3A is an illustration of an example time variation of a signal value during a clutter reflected light period.

In FIG. 3A, time t0 is a time at which the light source unit 20 emitted the irradiation light IL, and a period of time from t0 to t1 is the clutter reflected light period. Before and after the clutter reflected light period, the signal value output from the integrator 41 takes a value near a reference value S corresponding to ambient light. Within the clutter reflected light period, immediately after time t0 at which the light source unit 20 emitted the irradiation light IL, the light receiving unit 30 receives the clutter reflected light RLc, and almost all of the SPADs 31 are each ready to output a High signal indicating incidence of a photon. Since the clutter reflected light RLc is light reflected at a close distance from the light source unit 20, the intensity of the clutter reflected light RLc is significantly higher than intensities of the ambient light and the measurement reflected light RLm. Therefore, when the light receiving unit 30 receives the clutter reflected light RLc, the signal value output from the integrator 41 increases sharply and clips at a signal value $S_{CL}$. The signal value $S_{CL}$ indicates the number of SPADs 31 that outputted the High signal upon arrival of the clutter reflected light RLc at the light-receiving surface 32. When all of the SPADs 31 forming the light-receiving surface 32 output the High signal, the signal value $S_{CL}$ clips at a maximum value sat as illustrated in FIG. 3A.

At step S40, the determiner 51 determines whether the signal value of the signal indicating incidence of photons of the clutter reflected light RLc has increased to a target rise value TR. In the first embodiment, the determiner 51 determines whether the signal value $S_{CL}$ at which the signal value clips in response to incidence of the clutter reflected light RLc is equal to or greater than the target rise value TR. If the signal value of the signal indicating incidence of photons of the clutter reflected light RLc has increased to the target rise value TR, that is, if the signal value $S_{CL}$ at which the signal value clips is equal to or greater than the target rise value TR, the determiner 51 ends the abnormality detection process without setting a flag indicating that an abnormality has been detected.

Figure 3B:
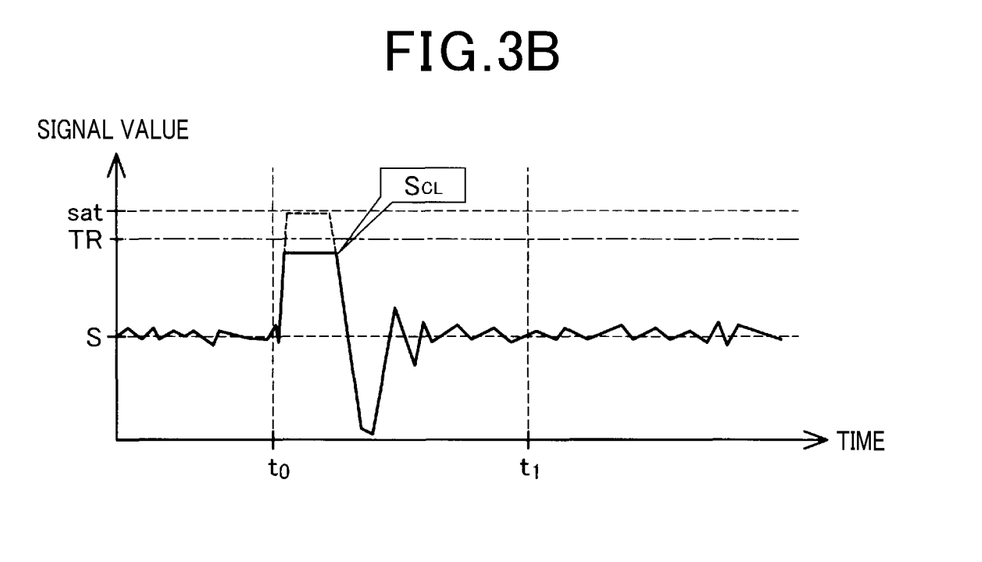
FIG. 3B is an illustration of an example case where the signal value fails to increase to a target rise value.

As illustrated in FIG. 3B, if the signal value of the signal indicating incidence of photons of the clutter reflected light RLc fails to increase to the target rise value TR, that is, the signal value $S_{CL}$ at which the signal value $S_{CL}$ clips is less than the target rise value TR, then at step S50 the determiner 51 detects that an abnormality is occurring in the light receiving unit 30. The fact that the signal value $S_{CL}$ fails to increase to the target rise value TR means that the number of SPADs 31 in a Low-abnormality state exceeds an allowable number, where each SPAD in the Low-abnormality state does not output the High signal even in response to incidence of a photon and continues to output a Low signal. In the first embodiment, the determiner 51 determines that the abnormality in the light receiving unit 30 is arising from an increase in the number of SPADs 31 in the Low-abnormality state. The determiner 51 then sets a flag indicating that an abnormality has been detected and ends the abnormality detection process.

In the abnormality detection process, if the flag indicating that an abnormality has been detected in the light receiving unit 30 is set by the determiner 51, the controller 50 notifies the user of occurrence of the abnormality in the light receiving unit 30 via a notification device (not shown). As the number of SPADs 31 in the Low-abnormality state increases, an amount of decrease in the signal value $S_{CL}$ from a maximum signal value sat increases. The controller 50 may calculate the amount of decrease in the signal value $S_{CL}$ from the maximum signal value sat and acquire the number of SPADs 31 in the Low-abnormality state from the calculated amount of decrease in the signal value $S_{CL}$ and output it.

As described above, the ranging device 10 of the first embodiment uses, to detect an abnormality in the light receiving unit 30, the signals output in response to incidence of the clutter reflected light RLc that is irradiation light IL reflected within the housing 60. The intensity of the clutter reflected light RLc is significantly higher than the intensity of ambient light. Therefore, even in an environment where the ambient light is not constant, occurrence of an abnormality in the light receiving unit 30 can be accurately detected. In addition, the ranging device 10 of the first embodiment uses the signals indicating incidence of photons of the clutter reflected light RLc on the SPADs 31, which enables detection of an abnormality in the light receiving unit 30 caused by the presence of the SPADs 31 in the Low-abnormality state. The ranging device 10 of the first embodiment is configured to, in response to the signal value of the signal indicating incidence of photons of the clutter reflected light RLc on the SPADs 31 failing to reach the target rise value TR, determine that an abnormality is occurring in the light receiving unit 30. This can inhibit an abnormality in the light receiving unit 30 from being detected hypersensitively, for example, in cases where the number of SPADs 31 in the Low-abnormality state does not adversely affect the distance measurement.

2. Second Embodiment

Figure 4:
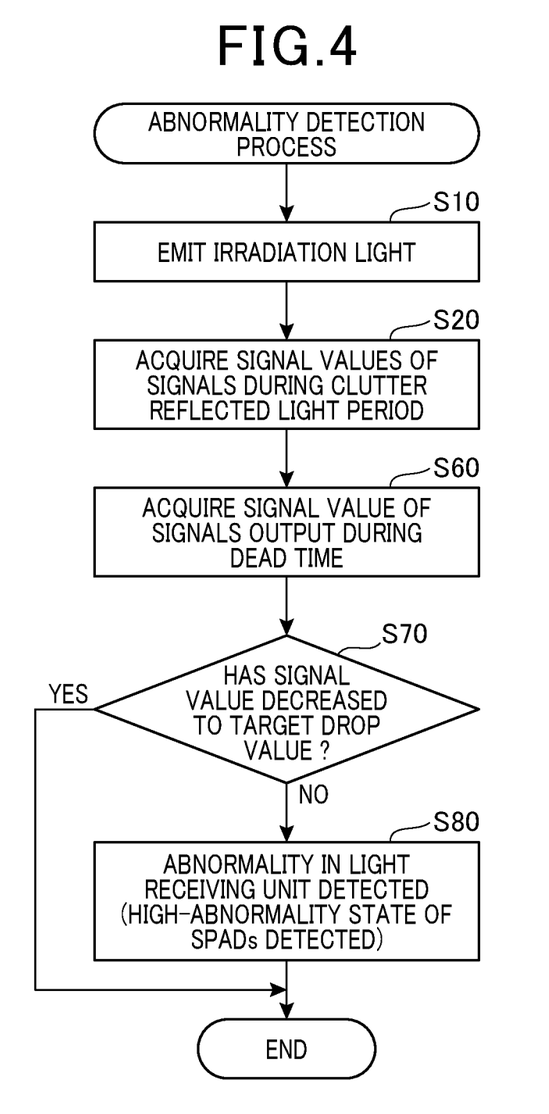
FIG. 4 is a flowchart of an abnormality detection process according to a second embodiment.

Referring to FIG. 4, the abnormality detection process of a second embodiment is performed by the ranging device 10 having the same configuration as described in the first embodiment. The abnormality detection process of the second embodiment is substantially the same as the abnormality detection process of the first embodiment illustrated in FIG. 2 except in that steps S60 to S80 are performed instead of steps S30 to S50 after steps S10 to S20.

At step S60, the determiner 51 acquires, from the integrator 41, signal values of signals output during a dead time in response to incidence of photons of the clutter reflected light RLc on the SPADs 31. The "dead time" means a period of time in which the SPADs 31 fail to detect photons because output signals from the SPADs 31 temporarily decrease to a Low level due to saturation of the SPADs 31 after incidence of photons.

Figure 5:
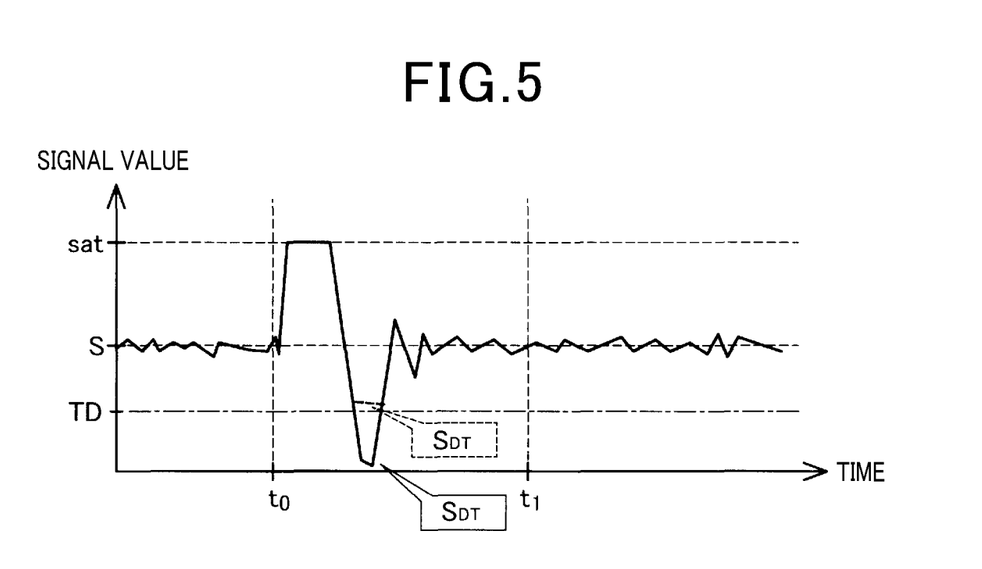
FIG. 5 is an illustration of signal values acquired during a dead time.

Referring to FIG. 5, the dead time within the clutter reflected light period is a period of time from when the signal value decreases to below the reference value S after having increased and being clipped in response to incidence of photons of the clutter reflected light RLc on the SPADs 31 to when the signal value increases again to the reference value S. Since, during this dead time, the SPADs 31 are saturated and thus fail to respond to incidence of photons of the clutter reflected light RLc, the signal value decreases sharply and clips regardless of the presence or absence of ambient light. As the number of SPADs 31 in a High-abnormality state increases, a signal value $S_{DT}$ at which the signal value clips increases, as indicated by the broken line graph in FIG. 5. The High-abnormality state is a state such that the SPAD 31 in the High-abnormality state does not normally output the Low signal even though in the dead time, but continues to output the High signal.

At step S70, the determiner 51 determines whether the signal value of the signal indicating incidence of photons of the clutter reflected light RLc has decreased to a predetermined target drop value TD within the dead time. In the second embodiment, the determiner 51 determines whether the signal value $S_{DT}$ at which the signal value clips within the dead time is less than the target drop value TD. If the signal value $S_{DT}$ decreases to below the target drop value TD, that is, if the signal value $S_{DT}$ at which the signal value clips within the dead time is less than the target drop value TD, the determiner 51 ends the abnormality detection process without setting a flag indicating that an abnormality has been detected.

If the signal value fails to decrease to below the target drop value TD within the dead time, that is, the signal value $S_{DT}$ at which the signal value clips within the dead time is equal to or greater than the target drop value TD, then at step S80 the determiner 51 detects that an abnormality is occurring in the light receiving unit 30. The fact that the signal value $S_{DT}$ fails to decrease to the target drop value TD means that the number of SPADs 31 in the High-abnormality state exceeds an allowable number. In the second embodiment, the determiner 51 determines that the abnormality in the light receiving unit 30 is arising from an increase in the number of SPADs 31 in the High-abnormality state. The determiner 51 sets a flag indicating that an abnormality has been detected and ends the abnormality detection process.

In the abnormality detection process, if the flag indicating that an abnormality has been detected in the light receiving unit 30 is set by the determiner 51, the controller 50 notifies the user of occurrence of the abnormality in the light receiving unit 30 via a notification device (not shown). The controller 50 may calculate an amount of increase in the signal value $S_{DT}$ at which the signal value clips within the dead time from the signal value when assumed that all of the SPADs 31 output the Low signal during the dead time and calculate the number of SPADs 31 in the High-abnormality state based on the calculated amount of increase in the signal value $S_{DT}$.

As described above, the ranging device 10 of the second embodiment uses, to detect an abnormality in the light receiving unit 30, the signals output in response to incidence of the clutter reflected light RLc that is irradiation light IL reflected within the housing 60. Therefore, as in the first embodiment, even in an environment where the ambient light is not constant, occurrence of an abnormality in the light receiving unit 30 can be accurately detected. In addition, the ranging device 10 of the second embodiment uses the signals output during the dead time after incidence of photons of the clutter reflected light RLc on the SPADs 31, which enables detection of an abnormality in the light receiving unit 30 caused by the presence of the SPADs 31 in the High-abnormality state. The ranging device 10 of the second embodiment is configured to, in response to the signal value failing to decrease to the target drop TD within the dead time, determine that an abnormality is occurring in the light receiving unit 30. This can inhibit an abnormality in the light receiving unit 30 from being detected hypersensitively, for example, in cases where the number of SPADs 31 in the High-abnormality state does not adversely affect the distance measurement.

3. Third Embodiment

Figure 6:
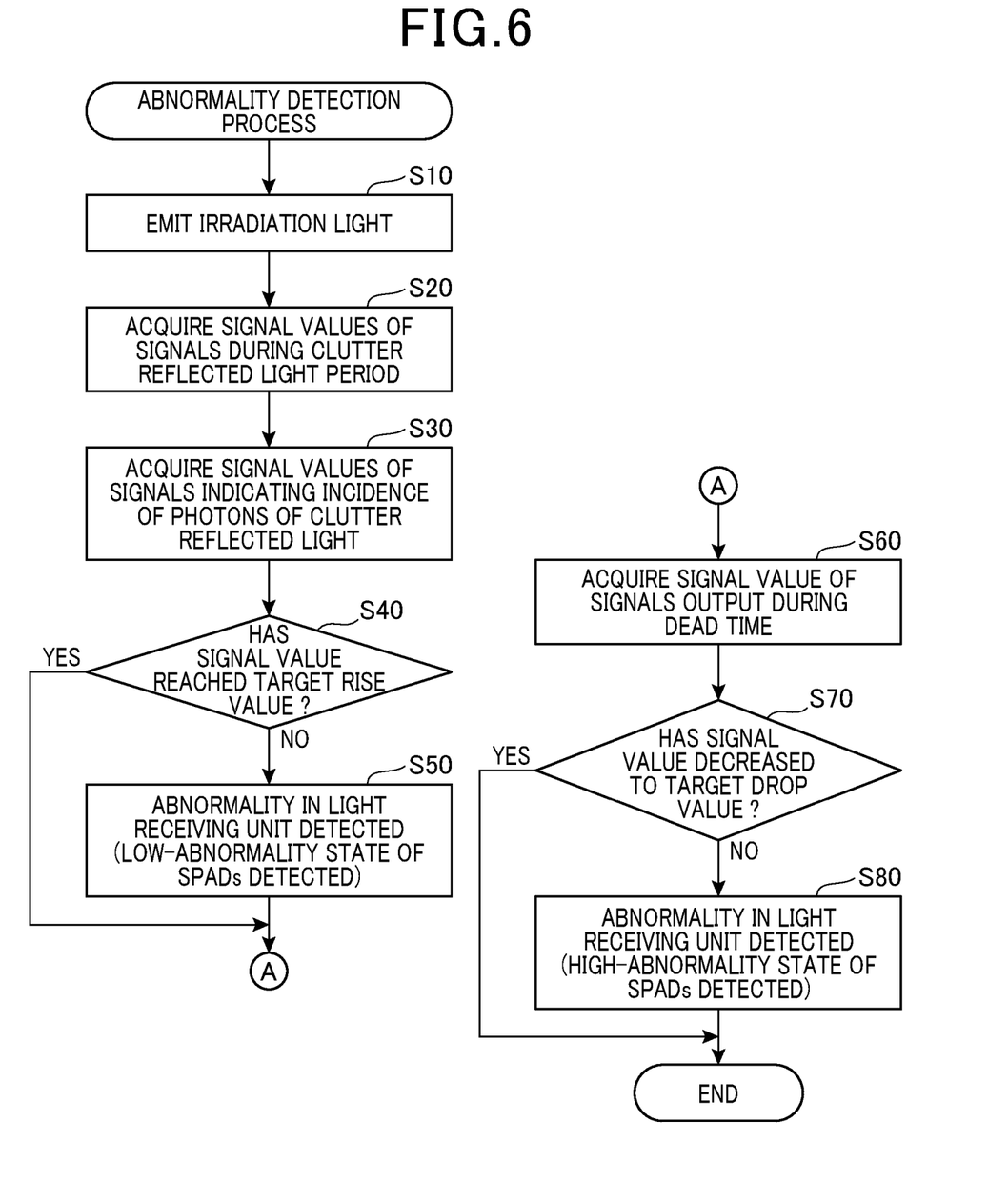
FIG. 6 is a flowchart of an abnormality detection process according to a third embodiment.

Referring to FIG. 6, the abnormality detection process of a third embodiment is performed by the ranging device 10 of the same configuration as described in the first embodiment. The abnormality detection process of the third embodiment is substantially the same as the abnormality detection process of the first embodiment illustrated in FIG. 2 except in that steps S60 to S80 are performed after steps S10 to S50.

The abnormality detection process of the third embodiment allows detection of the abnormality in the light receiving unit 30 caused by the presence of the SPADs 31 in the Low-abnormality state at steps S30 to S50. The abnormality detection process of the third embodiment allows detection of the abnormality in the light receiving unit 30 caused by the presence of the SPADs 31 in the High-abnormality state at steps S60 to S80. In addition, the abnormality detection process of the third embodiment further allows determining whether occurrence of the abnormality in the light receiving unit 30 is arising from the presence of the SPADs 31 in the Low-abnormality state, the presence of the SPADs 31 in the High-abnormality state, or both. The controller 50 may output the detected number of SPADs 31 in the Low-abnormality state and the detected number of SPADs 31 in the High-abnormality state. In addition, the method of detecting an abnormality in both the optical ranging device 10 and the light receiving unit 30 according to the third embodiment can provide various advantages similar to those described in the first embodiment and the second embodiment.

4. Modifications

The various configurations described in the above respective embodiments may be modified, for example, as described below. The modifications described below are all examples of the aspects of the present disclosure.

(M1) In an alternative embodiment to each of the above first and third embodiments, the determiner 51 may not make the determination at step S40 using the signal value $S_{CL}$ at which the signal value clips in response to incidence of photons of the clutter reflected light RLc on the SPADs 31 and the target rise value TR. The determiner 51 may detect an abnormality other than the Low abnormality in the SPADs 31 of the light receiving unit 30, using the signals indicating incidence of photons of the clutter reflected light RLc on the SPADs 31. In another alternative embodiment, the determiner 51 may detect that an abnormality is occurring in the light receiving unit 30 in cases where the signals indicating incidence of photons of the clutter reflected light RLc on the SPADs 31 are significantly different in waveform from a prepared reference signal.

(M2) In an alternative embodiment to each of the above second and third embodiments, the determiner 51 may not make the determination at step S70 using the signal value $S_{DT}$ at which the signal value clips within the dead time and the target drop value TD. The determiner 51 may detect an abnormality other than the High abnormality in the SPADs 31 of the light receiving unit 30, using the signals output from the light receiving unit 30 during the dead time. In another alternative embodiment, the determiner 51 may detect that an abnormality is occurring in the light receiving unit 30 in cases where the signals output from the light receiving unit 30 during the dead time are significantly different in waveform from a prepared reference signal.

(M3) In an alternative embodiment to each embodiment described above, the ranging device 10 may not be mounted to the vehicle. For example, the ranging device 10 may be configured as a ranging device to be carried by the user.

5. Others

It should be appreciated that the present disclosure is not to be limited to the optical ranging device disclosed above and the method of detecting occurrence of an abnormality in the light receiving unit of the optical ranging device. The present disclosure may be implemented in numerous ways, such as a vehicle having the optical ranging device disclosed above mounted thereto, a control method of controlling the optical ranging device, a computer program for enabling a computer to implement the control method, and a non-transitory computer readable storage medium storing such a computer program.

The present disclosure is not limited to any of the embodiments, the examples and the modifications described above but may be implemented by a diversity of other configurations without departing from the scope of the disclosure. For example, the technical features of the embodiments, examples or modifications corresponding to the technical features of the respective aspects may be replaced or combined appropriately, in order to solve part or all of the issues described above or in order to achieve part or all of the advantages described above. Any of the technical features may be omitted appropriately unless the technical feature is described as essential herein.

What is claimed is:

1. An optical ranging device comprising:
    a light source unit configured to emit irradiation light to irradiate a measurement region;
    a light receiving unit having a light-receiving surface provided with an array of single photon avalanche diodes (SPADs) and configured to use the SPADs to detect photons of reflected light of the irradiation light;
    a housing accommodating the light source unit and the light receiving unit;
    a controller configured to control the light source unit and the light receiving unit and perform a distance measurement process to measure a distance to an object in the measurement region using signals output from the SPADs upon receipt of measurement reflected light that is reflected light of the irradiation light from the object in the measurement region; and
    a determiner configured to determine presence or absence of an abnormality in the light receiving unit using signals output from the SPADs upon receipt of clutter reflected light during a clutter reflected light period, the clutter reflected light comprising reflected light of the irradiation light reflected within the housing, the clutter reflected light period comprising a time period beginning immediately after the light source unit emits the irradiation light to irradiate the measurement region and ending before receipt of the measurement reflected light,
    the determiner configured to determine the presence or absence of the abnormality in the light receiving unit using signals output from the SPADs by
        acquiring a signal value output from the light receiving unit during a clutter reflected light period,
        comparing the signal value to a target rise value, and
        determining the presence of the abnormality in the light receiving unit based on the signal value not exceeding the target rise value,
    wherein
    the determiner is further configured to determine presence or absence of an abnormality in the light receiving unit using signals output during a dead time following incidence of photons of the clutter reflected light on the SPADs, the dead time comprising a period of time within the clutter reflected light period from a time when the signal value decreases to below a reference value to a time when the signal value increases to the reference value.

2. The optical ranging device according to claim 1, wherein
    the determiner is configured to determine presence or absence of an abnormality in the light receiving unit using signals indicating incidence of photons of the clutter reflected light on the SPADs.

3. The optical ranging device according to claim 2, wherein
    the determiner is configured to, in response to a signal value that results from counting a number of signals indicating incidence of photons of the clutter reflected light on the SPADs failing to increase to a predetermined target rise value, determine that an abnormality is occurring in the light receiving unit.

4. The optical ranging device according to claim 1, wherein
    the determiner is configured to, in response to a signal value that results from counting a number of signals output during the dead time failing to decrease to a predetermined target drop value, determine that an abnormality is occurring in the light receiving unit.

5. The optical ranging device according to claim 1, wherein
    the determiner is configured to, in response to determining that an abnormality is occurring in the light receiving unit, output a number of the SPADs in which the abnormality is occurring using the signals output from the SPADS.

6. A method for determining presence or absence of an abnormality in a light receiving unit having a light-receiving surface provided with an array of single photon avalanche diodes (SPADs), the light receiving unit being incorporated in an optical ranging device configured to perform a distance measurement process to measure a distance to an object in a measurement region using signals output from the SPADs upon receipt of measurement reflected light of irradiation light reflected from the object, the irradiation light being emitted from a light source unit incorporated in the optical ranging device, the method comprising:

causing the light receiving unit to receive clutter reflected light that is reflected light of the irradiation light reflected within a housing accommodating the light source unit and the light receiving unit;

determining presence or absence of an abnormality in the light receiving unit using signals output from the SPADs upon receipt of the clutter reflected light during a clutter reflected light period, the clutter reflected light comprising reflected light of the irradiation light reflected within the housing, the clutter reflected light period comprising a time period beginning immediately after the light source unit emits the irradiation light to irradiate the measurement region and ending before receipt of the measurement reflected light, the presence or absence of the abnormality in the light receiving unit being determined using signals output from the SPADs by    acquiring a signal value output from the light receiving unit during a clutter reflected light period,    comparing the signal value to a target rise value, and    determining the presence of the abnormality in the light receiving unit based on the signal value not exceeding the target rise value, wherein the determining including determining presence or absence of an abnormality in the light receiving unit using signals output during a dead time following incidence of photons of the clutter reflected light on the SPADs, the dead time comprising a period of time within the clutter reflected light period from a time when the signal value decreases to below a reference value to a time when the signal value increases to the reference value.

7. An optical ranging device comprising:

a light source unit configured to emit irradiation light to irradiate a measurement region;

a light receiving unit having a light-receiving surface provided with an array of single photon avalanche diodes (SPADs) and configured to use the SPADs to detect photons of reflected light of the irradiation light;

a housing accommodating the light source unit and the light receiving unit;

a controller configured to control the light source unit and the light receiving unit and perform a distance measurement process to measure a distance to an object in the measurement region using signals output from the SPADs upon receipt of measurement reflected light that is reflected light of the irradiation light from the object in the measurement region; and a determiner configured to determine presence or absence of an abnormality in the light receiving unit using signals output from the SPADs upon receipt of clutter reflected light that is reflected light of the irradiation light reflected within the housing, the determiner being further configured to determine presence or absence of an abnormality in the light receiving unit using signals output during a dead time following incidence of photons of the clutter reflected light on the SPADs, wherein the determiner is configured to, in response to a signal value that results from counting a number of signals output during the dead time failing to decrease to a predetermined target drop value, determine that an abnormality is occurring in the light receiving unit.

8. A method for determining presence or absence of an abnormality in a light receiving unit having a light-receiving surface provided with an array of single photon avalanche diodes (SPADs), the light receiving unit being incorporated in an optical ranging device configured to perform a distance measurement process to measure a distance to an object in a measurement region using signals output from the SPADs upon receipt of reflected light of irradiation light reflected from the object, the irradiation light being emitted from a light source unit incorporated in the optical ranging device, the method comprising:

causing the light receiving unit to receive clutter reflected light that is reflected light of the irradiation light reflected within a housing accommodating the light source unit and the light receiving unit;

determining presence or absence of an abnormality in the light receiving unit using signals output from the SPADs upon receipt of the clutter reflected light, the determining including determining presence or absence of an abnormality in the light receiving unit using signals output during a dead time following incidence of photons of the clutter reflected light on the SPADs, wherein in response to a signal value that results from counting a number of signals output during the dead time failing to decrease to a predetermined target drop value, an abnormality is determined to be occurring in the light receiving unit.

\* \* \* \* \*